United States Patent
Lee et al.

(10) Patent No.: US 8,861,080 B2
(45) Date of Patent: Oct. 14, 2014

(54) WIRE GRID POLARIZERS, METHODS OF FABRICATING A WIRE GRID POLARIZER, AND DISPLAY PANELS INCLUDING A WIRE GRID POLARIZER

(75) Inventors: Chang-seung Lee, Yongin-si (KR); Jun-seong Kim, Yongin-si (KR); Ki-deok Bae, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 276 days.

(21) Appl. No.: 13/350,995

(22) Filed: Jan. 16, 2012

(65) Prior Publication Data

US 2012/0287507 A1     Nov. 15, 2012

(30) Foreign Application Priority Data

May 13, 2011    (KR) ........................ 10-2011-0045120

(51) Int. Cl.
*G02B 5/30*          (2006.01)
*G02F 1/1335*     (2006.01)
*B29C 35/08*       (2006.01)
*B82Y 20/00*       (2011.01)
*G03F 7/00*         (2006.01)

(52) U.S. Cl.
CPC ............. *G02B 5/3058* (2013.01); *B82Y 20/00* (2013.01); *G03F 7/0002* (2013.01); *Y10S 359/90* (2013.01); *Y10S 977/888* (2013.01)
USPC ........ 359/485.05; 359/900; 349/96; 264/496; 264/104; 977/888

(58) Field of Classification Search
USPC .................. 359/485.05, 487.03, 900; 349/96; 264/496, 104; 977/888
See application file for complete search history.

(56) References Cited

U.S. PATENT DOCUMENTS

| | | | |
|---|---|---|---|
| 7,054,064 B2* | 5/2006 | Jiang et al. | 359/485.05 |
| 7,106,507 B2* | 9/2006 | Lee et al. | 359/485.05 |
| 7,561,332 B2* | 7/2009 | Little et al. | 359/485.05 |
| 7,854,864 B2* | 12/2010 | Sato et al. | 264/1.6 |
| 7,872,803 B2* | 1/2011 | Uejima et al. | 359/485.05 |
| 8,014,068 B2* | 9/2011 | Cheong et al. | 359/485.05 |
| 8,027,086 B2* | 9/2011 | Guo et al. | 359/485.05 |
| 8,133,428 B2* | 3/2012 | Kaida et al. | 264/496 |
| 8,205,551 B2* | 6/2012 | Begon et al. | 101/483 |
| 8,517,082 B2* | 8/2013 | Usami et al. | 164/46 |
| 2007/0014018 A1* | 1/2007 | Wheatley et al. | 359/580 |
| 2007/0154634 A1* | 7/2007 | Renn | 427/180 |
| 2008/0095985 A1* | 4/2008 | Frey et al. | 428/156 |

(Continued)

FOREIGN PATENT DOCUMENTS

| | | | |
|---|---|---|---|
| JP | 2009-236945 A | | 10/2009 |
| JP | 2009-237473 A | | 10/2009 |
| KR | 10-0793176 B1 | | 1/2008 |

(Continued)

*Primary Examiner* — Frank Font
(74) *Attorney, Agent, or Firm* — Harness, Dickey & Pierce, P.L.C.

(57) ABSTRACT

Wire grid polarizers, methods of fabricating a wire grid polarizer and display panels including a wire grid polarizer are provided, the methods include preparing a mold having a lower surface in which a plurality of parallel fine grooves are formed, and arranging the mold on a transparent substrate. The plurality of parallel fine grooves are filled with a conductive liquid ink. A plurality of parallel conductive nano wires are formed on the transparent substrate by curing the conductive liquid ink. The mold is removed.

21 Claims, 7 Drawing Sheets

(56) References Cited

U.S. PATENT DOCUMENTS

| | | | |
|---|---|---|---|
| 2009/0098380 A1* | 4/2009 | Henn et al. | 428/402 |
| 2010/0007827 A1* | 1/2010 | Nishimura et al. | 349/117 |
| 2012/0125880 A1* | 5/2012 | Slafer | 216/11 |
| 2012/0127404 A1* | 5/2012 | Takada | 349/96 |
| 2012/0206805 A1* | 8/2012 | Meng et al. | 359/487.03 |

FOREIGN PATENT DOCUMENTS

| | | |
|---|---|---|
| KR | 10-2008-0038602 A | 5/2008 |
| KR | 10-2008-0057063 A | 6/2008 |
| KR | 10-2008-0057064 A | 6/2008 |
| KR | 10-2010-0044176 A | 4/2010 |
| KR | 10-2010-0049763 A | 5/2010 |
| KR | 10-2010-0049766 A | 5/2010 |

* cited by examiner

WIRE GRID POLARIZERS, METHODS OF FABRICATING A WIRE GRID POLARIZER, AND DISPLAY PANELS INCLUDING A WIRE GRID POLARIZER

CROSS-REFERENCE TO RELATED APPLICATIONS

This application claims the benefit of priority under §119(e) to Korean Patent Application No. 10-2011-0045120, filed on May 13, 2011, in the Korean Intellectual Property Office, the disclosure of which is incorporated herein by reference in its entirety.

BACKGROUND

1. Field

Example embodiments relate to wire grid polarizers, methods of fabricating a wire grid polarizer, and display panels including a wire grid polarizer. Other example embodiments relate to a method of fabricating a wire grid polarizer by which a large-size wire grid polarizer is easily fabricated, a wire grid polarizer fabricated by the above method, and a display panel including a wire grid polarizer.

2. Description of the Related Art

Image forming apparatuses (e.g., liquid crystal display devices), which require a separate light source, use a polarizer as an element for forming an image by controlling transmission/shutting of light. However, because an absorption-type polarizer has been mainly used as a polarizer, only half of light emitted from a light source is used and the remaining half of the light is absorbed by the polarizer. The absorption-type polarizer is considered to be one of the major contributors to the reduction in the light-use efficiency of a display device. For example, in a liquid crystal display device, because a polarizer is arranged on each of front and rear surfaces of a liquid crystal layer, the light-use efficiency is only below 10% including light loss due to a color filter. This means that only about 10% of the light emitted from a backlight unit actually contributes formation of an image.

Such a low efficiency is a problem in power consumption of high bright electronics (e.g., televisions (TVs)). Accordingly, a variety of methods have been suggested to address the low light-use efficiency. For example, there is a method of attaching a bright enhancement film such as a dual brightness enhancement film (DBEF) to a backlight unit. However, the additional use of an optical film raises costs.

Recently, a reflection-type polarizer (e.g., a wire grid polarizer) is used instead of the absorption-type polarizer. A wire grid polarizer is a polarizer in which a plurality of conductive nano wires are arranged parallel to each other on a transparent insulation substrate. In general, when a pitch of the parallel-arranged nano wires is close to or greater than the wavelength of incident light, a typical diffraction phenomenon occurs. However, when a pitch of the nano wires is smaller than the wavelength of incident light, a polarization separation phenomenon occurs much more than diffraction. For example, when a pitch of nano wires is not greater than about 100 nm, light that is polarized in a direction parallel to the nano wires is reflected, whereas light that is polarized in a direction perpendicular to the nano wires is transmitted. Thus, only a light component in a particular polarization direction perpendicular to the nano wires may be transmitted to the wire grid polarizer. Because the other light component is reflected without being absorbed, most of the incident light may be substantially used by changing the polarization direction of the reflected light.

As described above, to allow the wire grid polarizer to appropriately function as a polarizer throughout the entire range of visible ray, the pitch of nano wires needs to be at least 100 nm or smaller. Also, as an aspect ratio of nano wires increases (i.e., the height of nano wires is greater than the width thereof), a polarization separation ratio of a wire grid polarizer is improved. Nevertheless, it is very difficult to fabricate a large-size wire grid polarizer satisfying the above conditions. Despite the many merits described above, the wire grid polarizer has not been widely used for large-size display devices (e.g., TVs).

SUMMARY

Example embodiments relate to wire grid polarizers, methods of fabricating a wire grid polarizer, and display panels including a wire grid polarizer. Other example embodiments relate to a method of fabricating a wire grid polarizer by which a large-size wire grid polarizer is easily fabricated, a wire grid polarizer fabricated by the above method, and a display panel including a wire grid polarizer.

Provided are methods of fabricating a wire grid polarizer, by which a large-size wire grid polarizer is easily fabricated, a wire grid polarizer fabricated by the above method, and display panels incorporated with the wire grid polarizer.

Additional aspects will be set forth in part in the description which follows and, in part, will be apparent from the description, or may be learned by practice of the presented embodiments.

According to example embodiments, a method of fabricating a wire grid polarizer includes preparing a mold having a lower surface in which a plurality of parallel fine grooves are formed, arranging the mold on a transparent substrate, filling the plurality of parallel fine grooves with a conductive liquid ink, forming a plurality of parallel conductive nano wires on the transparent substrate by curing the conductive liquid ink, and removing the mold.

The plurality of parallel conductive nano wires may be formed by curing and solidifying the conductive liquid ink.

The preparing of the mold may include forming a nano pattern having a plurality of linear patterns that are arranged parallel to each other, on a mold substrate, forming a mold by providing a liquid mold material on the mold substrate and curing the liquid mold material, and separating the mold from the mold substrate.

The preparing of the mold may further include performing a plasma process or a chemical process on the mold to make a surface of the mold hydrophilic.

The liquid mold material may be polydimethylsiloxane (PDMS).

The forming of the nano pattern on the mold substrate may include coating the mold substrate with a photoresist, exposing the photoresist to a light having a plurality of parallel linear patterns, and forming the nano pattern from the photoresist on the mold substrate by developing exposed photoresist.

The exposing of the photoresist may include using a surface plasmon polariton lithography technology or an extreme ultraviolet interference lithography technology.

The forming of the nano pattern on the mold substrate may include forming a block copolymer in which at least two different polymers are repeatedly formed, on the mold substrate, and forming the nano pattern by removing any one of the at least two copolymers using reactive ion etching.

The block copolymer may include polystyrene (PS) and poly(methyl methacrylate) (PMMA) that are repeatedly formed. The PMMA may be removed to form the nano pattern including only the PS arranged in a parallel manner at a certain interval (i.e., the nano pattern including the PS and excluding the PMMA). The nano pattern including only the PS may be formed by removing only the PMMA through the reactive ion etching.

The lower surface of the mold, in which the plurality of parallel fine grooves are formed, may face an upper surface of the transparent substrate.

The filling of the plurality of parallel fine grooves with the conductive liquid ink may include arranging an ink reservoir containing the conductive liquid ink at entrances (or openings) of the plurality of parallel fine grooves, and filling the plurality of parallel fine grooves with the conductive liquid ink using a capillary phenomenon.

According to other example embodiments, a method of fabricating a wire grid polarizer includes forming a nano pattern on a transparent substrate, wherein the nano pattern has a plurality of linear patterns that are arranged parallel to each other. The method further includes forming a plurality of parallel trenches in an upper surface of the transparent substrate by etching the transparent substrate using the nano pattern as an etch mask, covering the upper surface of the transparent substrate using a cover to seal upper portions of the plurality of parallel trenches, filling the plurality of parallel trenches with a conductive liquid ink through entrances (or openings) of lateral surfaces of the plurality of parallel trenches, and forming a plurality of parallel conductive nano wires that are engraved in the transparent substrate, by curing the conductive liquid ink.

The plurality of parallel conductive nano wires may be formed by curing and solidifying the conductive liquid ink.

The method may further include removing the cover from the upper surface of the transparent substrate, and removing the nano pattern remaining on the transparent substrate using a planarization technology.

The forming of the nano pattern on the transparent substrate may include coating a mold substrate with a photoresist, exposing the photoresist to a light having a plurality of parallel linear patterns, and forming the nano pattern from the photoresist on the mold substrate by developing the exposed photoresist.

The exposing of the photoresist may include using a surface plasmon polariton lithography technology or an extreme ultraviolet interference lithography technology.

The filling of the plurality of parallel trenches with the conductive liquid ink may include arranging an ink reservoir containing the conducive liquid ink at entrances (or openings) of lateral surfaces of the plurality of parallel trenches of the transparent substrate, and filling the plurality of parallel trenches with the conductive liquid ink using a capillary phenomenon.

According to yet other example embodiments, a wire grid polarizer is fabricated by the above method.

According to still other example embodiments, a display panel includes a wire grid polarizer. The wire grid polarizer includes a transparent substrate, and a plurality of parallel conductive nano wires protruding from a lower surface of the transparent substrate. The display panel further includes a transparent protection layer formed on the lower surface of the transparent substrate, wherein the transparent protection layer covers the plurality of parallel conductive nano wires to protect the plurality of parallel conductive nano wires. The display device further includes a drive circuit layer and a pixel layer sequentially formed on an upper surface of the transparent substrate, wherein the wire grid polarizer is fabricated according to one of the above methods.

The transparent protection layer may be formed of silicon oxide ($SiO_2$) or silicon nitride ($SiN_x$).

According to yet still other example embodiments, a display panel includes a wire grid polarizer. The wire grid polarizer includes a transparent substrate, and a plurality of parallel conductive nano wires engraved in the transparent substrate. The display device further includes a transparent protection layer formed on a lower surface of the transparent substrate, wherein the transparent protection layer covers the plurality of parallel conductive nano wires to protect the plurality of parallel conductive nano wires. The display device further includes a drive circuit layer and a pixel layer sequentially formed on an upper surface of the transparent substrate, wherein the wire grid polarizer is fabricated according to one of the above methods.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1A:
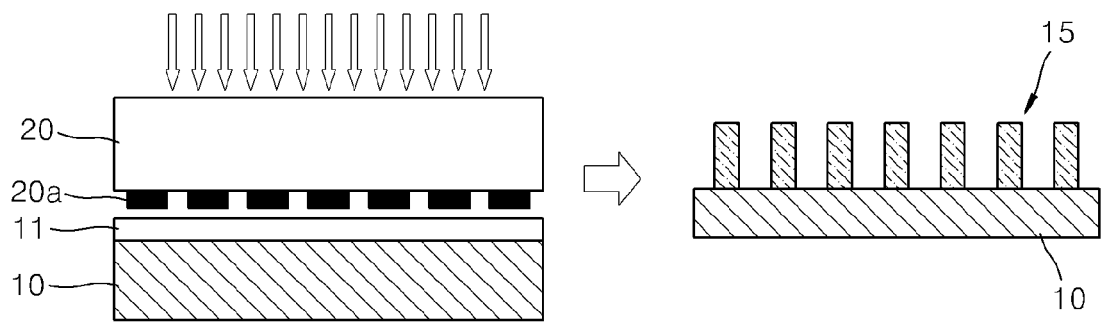
FIGS. 1A, 1B, and 1C schematically illustrate various methods of forming a nano pattern having the shape of a wire grid polarizer to be formed later, on a substrate according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments relate to wire grid polarizers, methods of fabricating a wire grid polarizer, and display panels including a wire grid polarizer. Other example embodiments relate to a method of fabricating a wire grid polarizer by which a large-size wire grid polarizer is easily fabricated, a wire grid polarizer fabricated by the above method, and a display panel including a wire grid polarizer.

Hereinafter, a wire grid polarizer, a method of fabricating the wire grid polarizer, and a display panel including the wire grid polarizer will be described in detail with reference to the accompanying drawings, wherein like reference numerals refer to like elements throughout. In this regard, the present example embodiments may have different forms and should not be construed as being limited to the descriptions set forth herein. Accordingly, the embodiments are merely described below, by referring to the figures, to explain aspects of the present description.

According to example embodiments, a nano patterning technology using a capillary phenomenon is suggested to fabricate a plurality of nano wires arranged parallel to each other on a transparent substrate. For example, a mold in which a plurality of parallel fine grooves are formed is attached on a transparent substrate. Then, liquid metal ink is supplied into the fine grooves so that the fine grooves are filled with the metal ink according to a capillary phenomenon. When the mold is removed after the metal ink filled in the fine grooves is cured and solidified, a pattern of the parallel nano wires corresponding to the shape of the fine grooves may be formed on the transparent substrate.

FIGS. 1A to 6 schematically illustrate a process of fabricating a wire grid polarizer with using a nano patterning technology according to example embodiments.

Figure 1B:
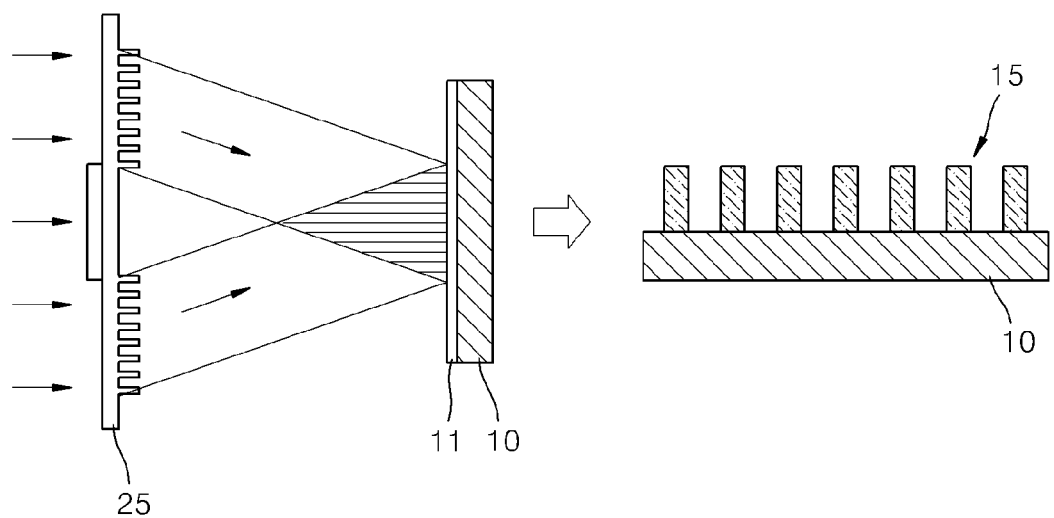
Figure 1C:
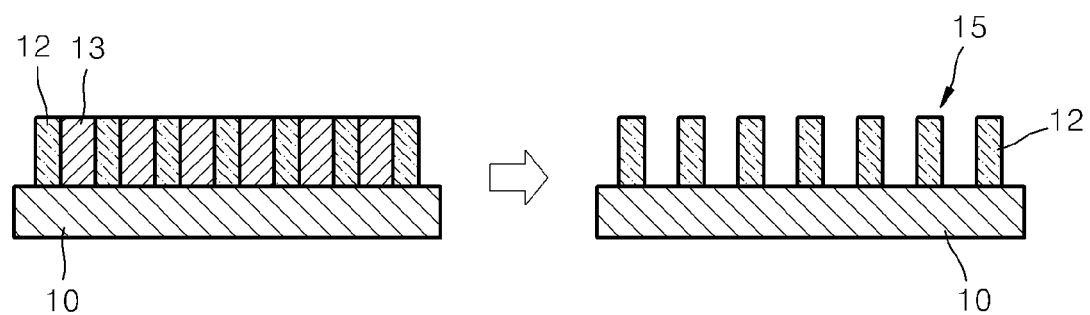
Figure 2:
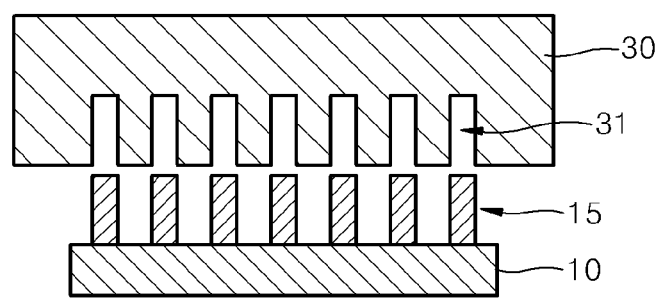
FIG. 2 schematically illustrates a process of fabricating a mold having the shape of a nano pattern formed according to any of the methods of FIGS. 1A, 1B, and 1C.

Referring to FIGS. 1A to 2, a mold 30 having a plurality of fine grooves 31 arranged parallel to each other on a lower surface thereof is provided. To form the mold, a nano pattern 15 corresponding to the fine grooves 31 is first formed on a mold substrate 10. The nano pattern 15 may be a pattern having the same shape as that of a plurality of parallel nano wires of a finished wire grid polarizer.

There may be a variety of methods to form the nano pattern 15 on the mold substrate 10 as illustrated in FIGS. 1A to 1C.

FIG. 1A illustrates an example of forming a nano pattern in a surface plasmon polariton lithography method.

Referring to FIG. 1A, a photoresist 11 is coated on the mold substrate 10 and then a photonic crystal layer 20 is arranged above the photoresist 11. A mask pattern 20a is formed on a lower surface of the photonic crystal layer 20. When a laser beam is irradiated onto the photonic crystal layer 20, the photoresist 11 may be exposed to surface plasmon polaritons generated by the interaction of the photonic crystal layer 20 and the mask pattern 20a. The surface plasmon polaritons are a type of surface electromagnetic waves generated on a boundary surface between a metal film and a dielectric. The surface plasmon polaritons are known to be generated by charge density oscillation generated on a surface of a metal film when light of a particular wavelength is incident on the metal film. According to a surface plasmon polariton lithography technology using the surface plasmon phenomenon, a very fine pattern may be formed overcoming an exiting limit in light diffraction. For example, a pattern having a width of about ⅛ of the wavelength of light irradiated onto the photonic crystal layer 20 may be formed by using the surface plasmon polariton lithography. For example, the surface plasmon polariton irradiated onto the photoresist 11 may be controlled to have a plurality of parallel linear patterns by the photonic crystal layer 20 and the mask pattern 20a. Thereafter, when the photoresist 11 exposed to surface plasmon polariton is developed and removed, the nano pattern 15 arranged in a parallel manner at a certain interval may be formed on the mold substrate 10.

FIG. 1B illustrates an example of forming a nano pattern using an extreme ultraviolet (EUV) interference lithography technology.

According to the EUV interference lithography technology, a nano structure having a regularity of about 20 nm or less may be manufactured by using a short wavelength and a light interference characteristic of EUV.

As illustrated in FIG. 1B, lights diffracted by two lattice masks 25 are provided onto the photoresist 11 coated on the mold substrate 10. Then, the two diffractive lights interfere with each other forming an interference pattern, thereby exposing the photoresist 11. The interference pattern may be formed to have, for example, a plurality of parallel linear patterns. When the exposed photoresist 11 is developed and removed, the nano pattern 15 on which the photoresist 11 is arranged at a constant interval may be formed on the mold substrate 10.

FIG. 1C illustrates a technology to form a nano pattern by selectively etching a block copolymer where at least two different polymers are repeatedly formed.

Referring to FIG. 1C, a block copolymer, where polystyrene (PS) 12 and poly(methyl methacrylate) (PMMA) 13 are repeatedly formed, is formed on the mold substrate 10. Then, only the PMMA 13 is removed using a reactive ion etching (RIE) technology, thus forming the nano pattern 15 in which the PS 12 only is arranged in a parallel manner at a certain interval on the mold substrate 10.

Because the nano pattern 15 may be formed in various ways in addition to the methods of FIGS. 1A to 1C, the method for forming the nano pattern on the mold substrate is not limited to the above-described methods of FIGS. 1A to 1C.

The nano pattern 15 may have a plurality of linear patterns arranged parallel to each other at a pitch of about 100 nm or less (e.g., about 50 nm). Each linear pattern may have a width of about 25 nm and a height of about 70 nm. The interval between the linear patterns may be about 25 nm.

FIG. 2 schematically illustrates a process of fabricating a mold having the shape of a nano pattern formed according to any of the methods of FIGS. 1A, 1B, and 1C.

Referring to FIG. 2, when the nano pattern 15 is formed on the mold substrate 10, the nano pattern 15 is filled with a liquid mold material, and then the liquid mold material is cured, thereby forming the mold 30. For example, polydimethylsiloxane (PDMS) may be used as a mold material. In this case, PDMS in the form of a liquid is poured over the mold substrate 10 where the nano pattern 15 is formed. When the PDMS is completely solidified and the mold 30 is formed, the mold 30 is separated from the mold substrate 10. Then, the fine grooves 31 that are arranged parallel to each other and complementary to the nano pattern 15 may be formed in a lower surface of the mold 30, as illustrated in FIG. 2.

Thereafter, the mold 30 formed as above may be processed to have a hydrophilic surface through a plasma process or a chemical process.

Figure 3:
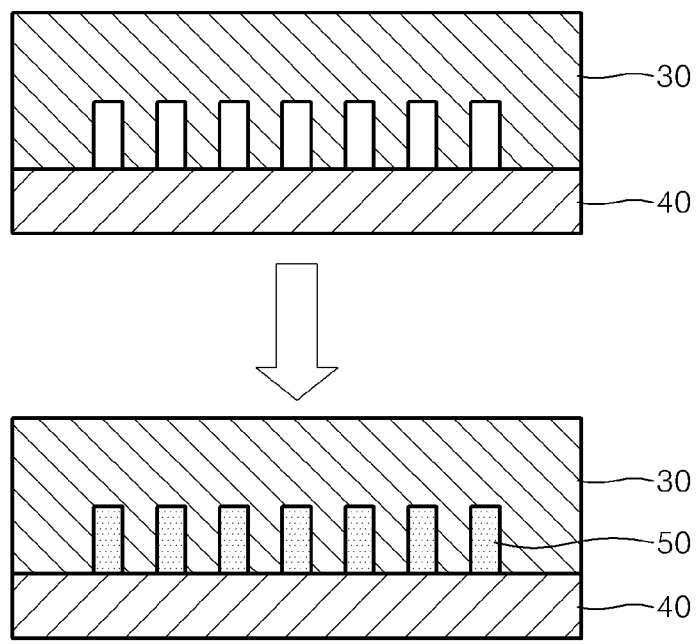
FIG. 3 is a cross-sectional view schematically illustrating a process of fabricating a plurality of conductive nano wires arranged parallel to each other on a transparent substrate using the mold of FIG. 2.

FIG. 3 is a cross-sectional view schematically illustrating a process of fabricating a plurality of conductive nano wires arranged parallel to each other on a transparent substrate using the mold of FIG. 2.

Referring to FIG. 3, the mold 30 is attached on the transparent substrate 40 where a wire grid polarizer is to be formed. The mold 30 is arranged such that a lower surface of the mold 30 where the fine grooves 31 are formed can face an upper surface of the transparent substrate 40. Then, the fine grooves 31 may be filled with a liquid metal ink 50 having conductivity.

The fine grooves 31 may be filled with the liquid metal ink 50 using a capillary phenomenon. The fine grooves 31 that are very thin and long may function as a sort of a capillary.

Figure 4:
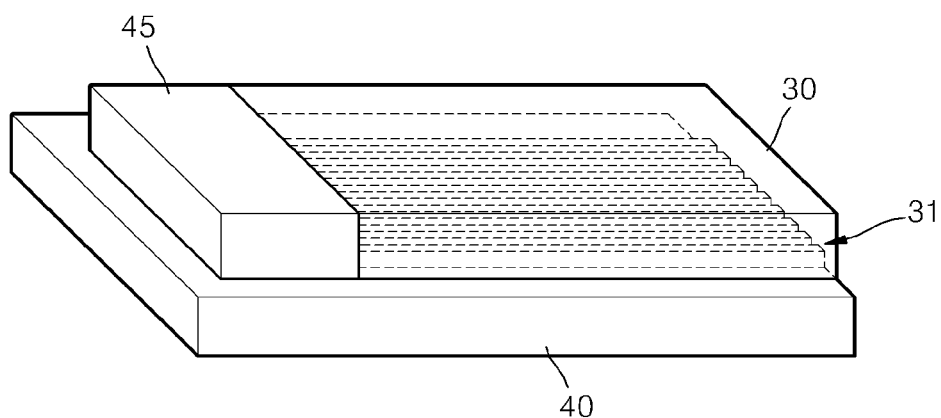
FIG. 4 is a perspective view schematically illustrating a process of fabricating a plurality of conductive nano wires arranged parallel to each other on a transparent substrate using the mold of FIG. 2.

FIG. 4 is a perspective view schematically illustrating a process of fabricating a plurality of conductive nano wires arranged parallel to each other on a transparent substrate using the mold of FIG. 2.

Referring to FIG. 4, an ink reservoir 45 containing the liquid metal ink 50 may be arranged at entrances (or openings) of the fine grooves 31 on an upper surface of the transparent substrate 40.

Figure 5A:
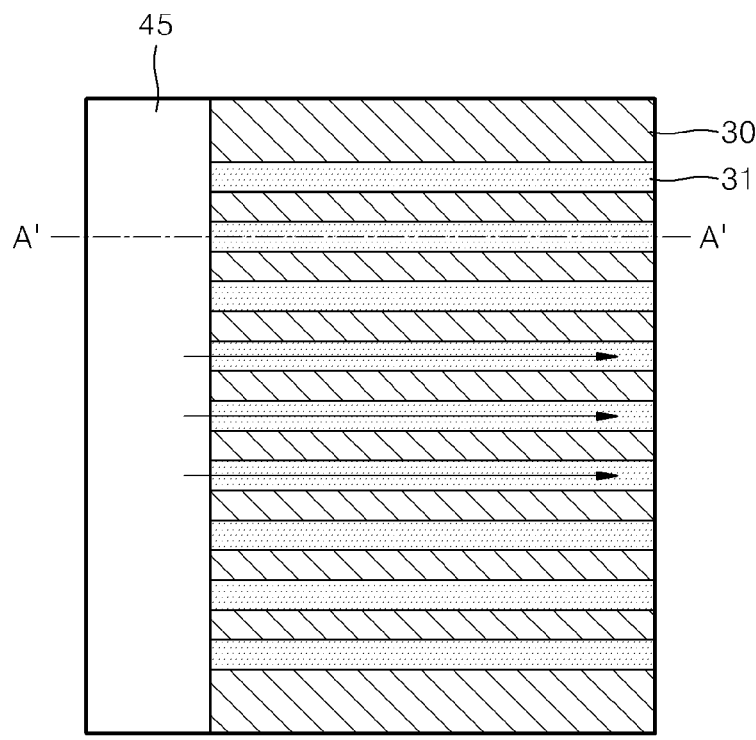
FIG. 5A is a horizontal cross-sectional view schematically illustrating a process of fabricating a plurality of conductive nano wires arranged parallel to each other on a transparent substrate using the mold of FIG. 2.
Figure 5B:
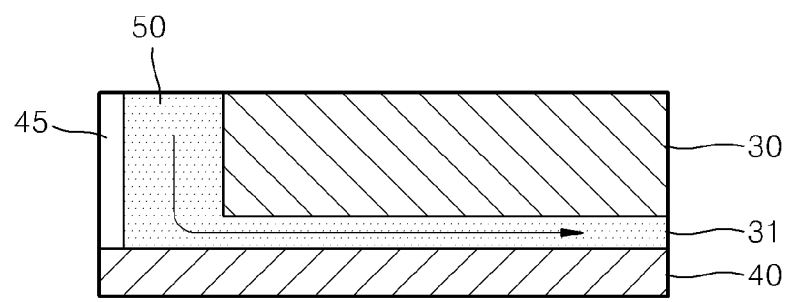
FIG. 5B is a vertical cross-sectional view taken along line A-A' of FIG. 5A.

FIG. 5A is a horizontal cross-sectional view schematically illustrating a process of fabricating a plurality of conductive nano wires arranged parallel to each other on a transparent substrate using the mold of FIG. 2, and FIG. 5B is a vertical cross-sectional view taken along line A'-A' of FIG. 5A.

Referring to FIGS. 5A and 5B, the liquid metal ink 50 in the ink reservoir 45 naturally fills each of the fine grooves 31 due to surface tension according to a capillary phenomenon. In particular, when the surface of the mold 30 is processed to be hydrophilic, the liquid metal ink 50 may more rapidly fill the fine grooves 31.

When the fine grooves 31 are completely filled with the liquid metal ink 50, the liquid metal ink 50 is cured at a low temperature (e.g., about 100° C.) to solidify the liquid metal ink 50 in the fine grooves 31.

Figure 6:
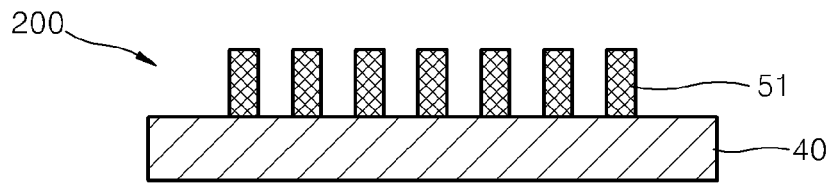
FIG. 6 is a cross-sectional view schematically illustrating a completed wire grid polarizer.

FIG. 6 is a cross-sectional view schematically illustrating a completed wire grid polarizer.

Referring to FIG. 6, when the ink reservoir 45 and the mold 30 on the transparent substrate 40 are removed, a plurality of parallel conductive nano wires 51 formed of metal remain on the transparent substrate 40. Thus, a wire grid polarizer 200 having the transparent substrate 40, and the parallel conductive nano wires 51 is formed.

FIGS. 7A to 7E schematically illustrate a method of fabricating a wire grid polarizer according to example embodiments.

Figure 7A:
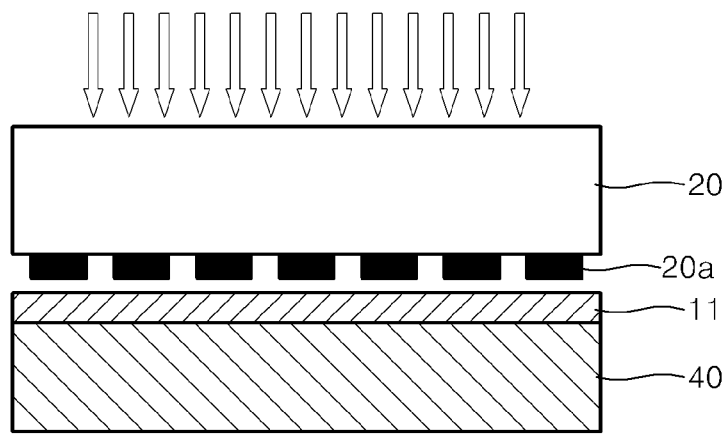
FIGS. 7A to 7E schematically illustrate a method of fabricating a wire grid polarizer according to example embodiments.

Referring to FIG. 7A, a photoresist 11 is coated on the transparent substrate 40 and exposed using, for example, a surface plasmon polariton lithography technology. An EUV interference lithography technology may be used instead of the surface plasmon polariton lithography technology.

Figure 7B:
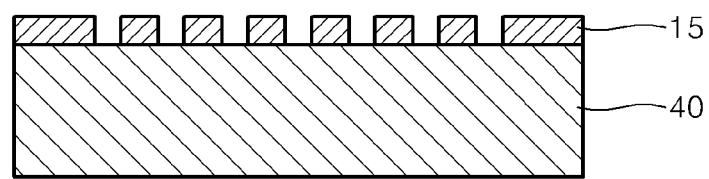

Referring to FIG. 7B, when the exposed photoresist 11 is developed, the nano pattern 15 arranged in a parallel manner at a certain interval may be formed on the transparent substrate 40. In FIGS. 7A and 7B, the nano pattern 15 is formed from the photoresist 11. However, as illustrated in FIG. 1C for example, the nano pattern 15 may be formed on the transparent substrate 40 using a block copolymer.

Figure 7C:
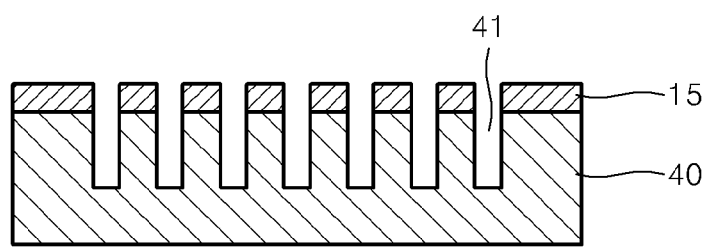

Referring to FIG. 7C, the transparent substrate 40 is etched using the nano pattern 15 on the transparent substrate 40 as an etch mask. For example, by etching an upper surface of the transparent substrate 40 that is exposed (i.e., portions not covered with the nano pattern 15) in a dry etching method, a plurality of parallel fine trenches 41 may be formed in an upper surface of the transparent substrate 40. The trenches 41 may be formed to have a width of, for example, about 25 nm, and a depth of, for example, about 70 nm. The interval between the trenches 41 may be, for example, about 25 nm.

Figure 7D:
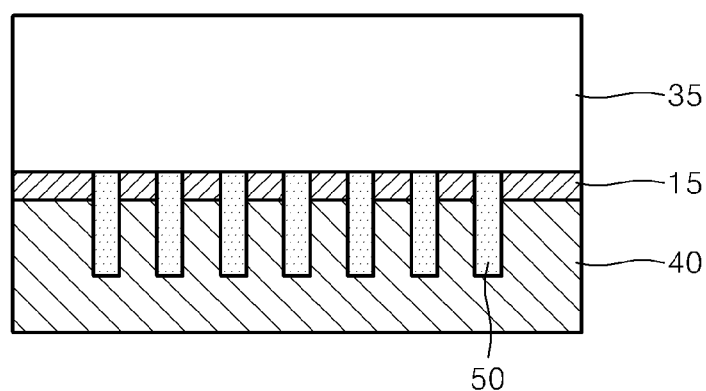

Referring to FIG. 7D, the upper surface of the transparent substrate 40 is covered by a cover 35 so that the upper portions of the trenches 41 may be completely sealed by the cover 35. For example, the cover 35 may be formed of a soft material such as PDMS. Accordingly, only lateral surfaces of the trenches 41 may be open to the outside. The ink reservoir 45 of FIG. 4 may, for example, be arranged at the lateral surface of the transparent substrate 40 to face the entrances (or openings) of the open lateral surfaces of the trenches 41. The liquid metal ink 50 contained in the ink reservoir 45 may naturally (i.e., based on its innate properties) fill the inside of each of the trenches 41 by passing through the entrances (or openings) of the open lateral surfaces of the trenches 41 due to surface tension according to a capillary phenomenon.

When the trenches 41 are completely filled with the metal ink 50, the metal ink 50 in the trenches 41 is cured and solidified at a low temperature of, for example, about 100° C. Then, the cover 35 is removed from the transparent substrate 40, and the nano pattern 15 remaining on the transparent substrate 40 may be removed using a planarization technology (e.g., chemical mechanical polishing (CMP)).

Figure 7E:
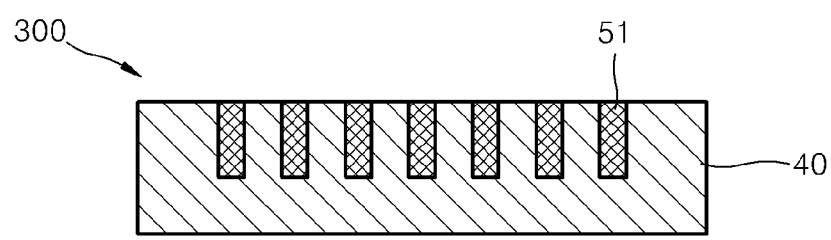

Referring to FIG. 7E, the parallel conductive nano wires 51 formed of metal remain in the trenches 41 of the transparent substrate 40. As a result, a wire grid polarizer 300, in which the parallel conductive nano wires 51 are engraved in the transparent substrate 40, may be formed.

According to the above-described methods of fabricating a wire grid polarizer according to example embodiments, a large-size wire grid polarizer may be easily fabricated at low costs. Also, because the pitch between nano wires can be decreased to 50 nm, an extinction ratio of the wire grid polarizer may be improved. Furthermore, according to the above-described methods according to example embodiments, because the wire grid polarizer can be fabricated at a relatively low temperature of about 100° C., a wire grid polarizer may be directly formed on a transparent substrate of, for example, a display panel. Thus, a display panel incorporated with a wire grid polarizer may be provided.

Figure 8A:
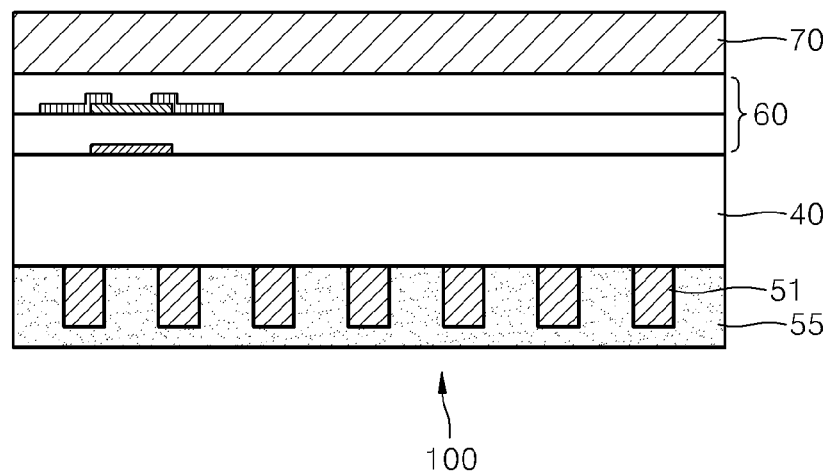
FIGS. 8A and 8B are cross-sectional views schematically illustrating a display panel including a wire grid polarizer according to example embodiments.
Figure 8B:
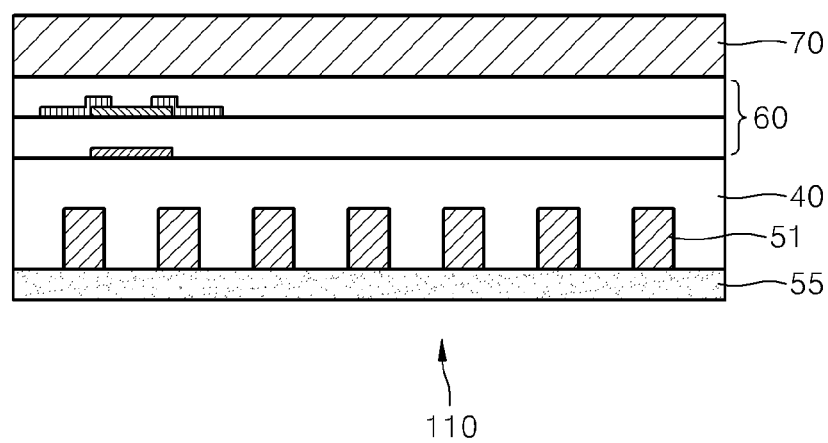

FIGS. 8A and 8B are cross-sectional views schematically illustrating a display panel incorporated with a wire grid polarizer. FIG. 8A illustrates an example of forming a wire grid polarizer in the method of FIG. 6. FIG. 8B illustrates an example of forming a wire grid polarizer in the method of FIGS. 7A to 7E.

Referring to FIG. 8A, a display panel 100 includes a plurality of parallel conductive nano wires 51 which protrude from the lower surface of the transparent substrate 40. A transparent protection layer 55 to protect the nano wires 51 is formed on the lower surface of the transparent substrate 40 completely covering the nano wires 51. For example, the protection layer 55 may be formed of, for example, silicon oxide ($SiO_2$) or silicon nitride ($SiN_x$). The transparent substrate 40 may be, for example, a rear substrate of the display panel 100. A drive circuit layer 60 where drive circuits or wirings including, for example, TFTs, are formed may be formed on the transparent substrate 40. A pixel layer 70 including, for example, a liquid crystal layer, to display an image may be formed on the drive circuit layer 60. Although it is not illustrated in the drawings, an electrode layer, a color filter layer, a front polarization panel, a front transparent substrate, or the like may be additionally formed on and above the pixel layer 70. When necessary, the elements that are not illustrated may be selected in a various combinations and additionally formed on the pixel layer 70.

Referring to FIG. 8B, a display panel 110 includes a plurality of parallel conductive nano wires 51 engraved in the lower surface of the transparent substrate 40. The transparent protection layer 55 to protect the nano wires 51 may be formed on the lower surface of the transparent substrate 40. The transparent substrate 40 may be, for example, a rear substrate of the display panel 110. The drive circuit layer 60 may be formed on the transparent substrate 40. The pixel layer 70 to display an image may be formed on the drive circuit layer 60.

As described above, the wire grid polarizer may be incorporated in the display panel 100 or 110. The display panel 100 or 110 does not require an additional absorption-type polarizer and a brightness enhancement film. Thus, as the wire grid polarizer is incorporated in a display panel, brightness of the display panel is improved and consumption power and costs may be further reduced.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. A method of fabricating a wire grid polarizer, the method comprising:
   preparing a mold having a lower surface in which a plurality of parallel fine grooves are formed;
   arranging the mold on a transparent substrate;
   filling the plurality of parallel fine grooves with a conductive liquid ink;
   forming a plurality of parallel conductive nano wires on the transparent substrate by curing the conductive liquid ink; and
   removing the mold.

2. The method of claim 1, wherein preparing the mold includes:
   forming a nano pattern on a mold substrate, the nano pattern having a plurality of linear patterns that are arranged parallel to each other;
   forming the mold by providing a liquid mold material on the mold substrate and curing the liquid mold material; and
   separating the mold from the mold substrate.

3. The method of claim 2, wherein preparing the mold further includes performing a plasma process or a chemical process on the mold to make a surface of the mold hydrophilic.

4. The method of claim 2, wherein the liquid mold material is polydimethylsiloxane (PDMS).

5. The method of claim 2, wherein forming the nano pattern on the mold substrate includes:
   coating the mold substrate with a photoresist;
   exposing the photoresist to a light having a plurality of parallel linear patterns; and
   forming the nano pattern from the photoresist by developing the exposed photoresist.

6. The method of claim 5, wherein exposing the photoresist includes using a surface plasmon polariton lithography technology or an extreme ultraviolet interference lithography technology.

7. The method of claim 2, wherein forming the nano pattern on the mold substrate includes:
   forming a block copolymer in which at least two different polymers are repeatedly formed on the mold substrate; and forming the nano pattern by removing any one of the at least two copolymers using reactive ion etching.

8. The method of claim 7, wherein the at least two different polymers are polystyrene (PS) and poly(methyl methacrylate) (PMMA), and
the PMMA is removed to form the nano pattern including only the PS arranged in a parallel manner at a certain interval.

9. The method of claim 1, wherein the lower surface of the mold, in which the plurality of parallel fine grooves are formed, faces an upper surface of the transparent substrate.

10. The method of claim 1, wherein filling the plurality of parallel fine grooves with the conductive liquid ink includes:
arranging an ink reservoir containing the conductive liquid ink at openings of the plurality of parallel fine grooves; and
filling the plurality of parallel fine grooves with the conductive liquid ink using a capillary phenomenon.

11. A method of fabricating a wire grid polarizer, the method comprising:
forming a nano pattern on a transparent substrate, the nano pattern having a plurality of linear patterns that are arranged parallel to each other;
forming a plurality of parallel trenches in an upper surface of the transparent substrate by etching the transparent substrate using the nano pattern as an etch mask;
covering the upper surface of the transparent substrate using a cover to seal upper portions of the plurality of parallel trenches;
filling the plurality of parallel trenches with a conductive liquid ink through openings of lateral surfaces of the plurality of parallel trenches; and
forming a plurality of parallel conductive nano wires that are engraved in the transparent substrate, by curing the conductive liquid ink.

12. The method of claim 11, further comprising:
removing the cover from the upper surface of the transparent substrate; and
removing the nano pattern remaining on the transparent substrate using a planarization technology.

13. The method of claim 11, wherein forming the nano pattern on the transparent substrate includes:
coating a mold substrate with a photoresist;
exposing the photoresist to a light having a plurality of parallel linear patterns; and
forming the nano pattern from the photoresist by developing the exposed photoresist.

14. The method of claim 13, wherein exposing the photoresist include using a surface plasmon polariton lithography technology or an extreme ultraviolet interference lithography technology.

15. The method of claim 11, wherein filling the plurality of parallel trenches with the conductive liquid ink includes:
arranging an ink reservoir containing the conducive liquid ink at openings of lateral surfaces of the plurality of parallel trenches; and
filling the plurality of parallel trenches with the conductive liquid ink using a capillary phenomenon.

16. A wire grid polarizer fabricated according to the method of claim 1.

17. A display panel, comprising:
a wire grid polarizer which includes a transparent substrate and a plurality of parallel conductive nano wires protruding from a lower surface of the transparent substrate;
a transparent protection layer on the lower surface of the transparent substrate, wherein the transparent protection layer covers the plurality of parallel conductive nano wires to protect the plurality of parallel conductive nano wires; and
a drive circuit layer and a pixel layer sequentially on an upper surface of the transparent substrate,
wherein the wire grid polarizer is fabricated according to the method of claim 1.

18. The display panel of claim 17, wherein the transparent protection layer is formed of silicon oxide ($SiO_2$) or silicon nitride ($SiN_x$).

19. A display panel, comprising:
a wire grid polarizer which includes a transparent substrate and a plurality of parallel conductive nano wires engraved in the transparent substrate;
a transparent protection layer on a lower surface of the transparent substrate, wherein the transparent protection layer covers the plurality of parallel conductive nano wires to protect the plurality of parallel conductive nano wires; and
a drive circuit layer and a pixel layer sequentially on an upper surface of the transparent substrate,
wherein the wire grid polarizer is fabricated according to the method of claim 11.

20. The method of claim 1, wherein forming the plurality of parallel conductive nano wires includes curing and solidifying the conductive liquid ink.

21. The method of claim 11, wherein forming the plurality of parallel conductive nano wires includes curing and solidifying the conductive liquid ink.

* * * * *